(12) United States Patent
Jung et al.

(10) Patent No.: US 11,106,882 B2
(45) Date of Patent: Aug. 31, 2021

(54) FINGERPRINT SENSING UNIT AND DISPLAY DEVICE INCLUDING THE SAME

(71) Applicant: SAMSUNG DISPLAY CO., LTD., Yongin-si (KR)

(72) Inventors: Keumdong Jung, Seoul (KR); Jaekyoung Kim, Hwaseong-si (KR); Wonsang Park, Yongin-si (KR); Jongin Baek, Hwaseong-si (KR); Yoshii Katsumasa, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 102 days.

(21) Appl. No.: 16/149,282

(22) Filed: Oct. 2, 2018

(65) Prior Publication Data
US 2019/0251318 A1 Aug. 15, 2019

(30) Foreign Application Priority Data
Feb. 14, 2018 (KR) .................. 10-2018-0018182

(51) Int. Cl.
*G06K 9/00* (2006.01)
*H01L 27/32* (2006.01)
*H01L 51/52* (2006.01)
*H01L 27/30* (2006.01)

(52) U.S. Cl.
CPC .......... *G06K 9/0002* (2013.01); *H01L 27/307* (2013.01); *H01L 27/323* (2013.01); *H01L 27/3234* (2013.01); *H01L 27/3246* (2013.01); *H01L 51/5253* (2013.01); *H01L 51/5256* (2013.01); *H01L 51/5275* (2013.01); *H01L 27/3216* (2013.01); *H01L 27/3218* (2013.01)

(58) Field of Classification Search
CPC . G06K 9/0002; H01L 51/5256; H01L 27/307; H01L 27/323; H01L 51/5275; H01L 27/3234; H01L 51/5253; H01L 27/3246; H01L 27/3218; H01L 27/3216
See application file for complete search history.

(56) References Cited

U.S. PATENT DOCUMENTS

| 8,592,833 | B2 | 11/2013 | Lee et al. |
| 9,853,093 | B2 | 12/2017 | Shim et al. |
| 9,880,688 | B2 | 1/2018 | Akhavan Fomani et al. |
| 9,891,746 | B2 | 2/2018 | Bae et al. |

(Continued)

FOREIGN PATENT DOCUMENTS

| KR | 10-2011-0106733 | 9/2011 |
| KR | 10-2016-0034458 | 3/2016 |
| KR | 10-1748123 | 6/2017 |

*Primary Examiner* — Jonathan A Boyd
(74) *Attorney, Agent, or Firm* — F. Chau & Associates, LLC

(57) ABSTRACT

The fingerprint sensing unit including: a substrate; a scan line disposed on the substrate and extending along a first direction; a common power line disposed on the substrate and extending along a second direction crossing the first direction; a thin film transistor connected to the scan line and the common power line; a sensing electrode connected to the thin film transistor; a first lens disposed on the sensing electrode and protruding in a direction away from the sensing electrode; and a first light blocking layer disposed on the sensing electrode and surrounding the first lens.

22 Claims, 10 Drawing Sheets

(56) References Cited

U.S. PATENT DOCUMENTS

| | | | | |
|---|---|---|---|---|
| 2010/0014313 A1* | 1/2010 | Tillin | ............ | G02B 27/0101 362/606 |
| 2014/0218327 A1* | 8/2014 | Shi | ............ | G06F 3/041 345/174 |
| 2014/0361264 A1* | 12/2014 | Choi | ............ | H01L 51/5275 257/40 |
| 2016/0087018 A1* | 3/2016 | Shim | ............ | H01L 51/5275 257/40 |
| 2017/0006245 A1* | 1/2017 | Akhavan Fomani | ............ | G06K 9/0002 |

* cited by examiner

FINGERPRINT SENSING UNIT AND DISPLAY DEVICE INCLUDING THE SAME

CROSS-REFERENCE TO RELATED APPLICATION

This application claims priority under 35 U.S.C. § 119 to Korean Patent Application No. 10-2018-0018182, filed on Feb. 14, 2018, in the Korean Intellectual Property Office (KIPO), the disclosure of which is incorporated by reference herein in its entirety.

TECHNICAL FIELD

Exemplary embodiments of the present invention relate to a fingerprint sensing unit and a display device including the fingerprint sensing unit.

DISCUSSION OF RELATED ART

Presently, display devices are classified either as liquid crystal display ("LCD") devices, organic light emitting diode ("OLED") display devices, plasma display panel ("PDP") display devices, or electrophoretic display devices based on a light emitting scheme thereof.

Over time, various functions have been added to display devices in addition to the function of displaying images. For example, some display devices may have a touch sensing function and a fingerprint recognition function.

The fingerprint sensing may be classified either as a capacitive type, an optical type, a thermal type, or an ultrasonic type, for example. The capacitive type is a method of recognizing a fingerprint by sensing a capacitance difference based on a distance between a ridge and a valley of the fingerprint using sensing electrodes.

The fingerprint sensing unit includes a plurality of wirings for recognizing fingerprints in a display area of the display device. The fingerprint sensing unit is also disposed in the display area of the display device. In addition, a moire phenomenon in which a plurality of wirings are visibly recognized may occur, and external light reflection by the plurality of wirings may occur.

SUMMARY

According to an exemplary embodiment of the present invention, a fingerprint sensing unit includes: a substrate; a scan line disposed on the substrate and extending along a first direction; a common power line disposed on the substrate and extending along a second direction crossing the first direction; a thin film transistor connected to the scan line and the common power line; a sensing electrode connected to the thin film transistor; a first lens disposed on the sensing electrode and protruding in a direction away from the sensing electrode; and a first light blocking layer disposed on the sensing electrode and surrounding the first lens.

In an exemplary embodiment of the present invention, the first lens may have a refractive index in a range from about 1.60 to about 1.80.

In an exemplary embodiment of the present invention, the first lens may include a plurality of lenses overlapping the sensing electrode.

In an exemplary embodiment of the present invention, the first light blocking layer may overlap at least part of the scan line, the common power line, the thin film transistor, and the sensing electrode.

According to an exemplary embodiment of the present invention, a display device includes: a display unit and a fingerprint sensing unit disposed on the display unit. The fingerprint sensing unit includes: a substrate having a first surface and a second surface opposite the first surface; a scan line disposed on the first surface of the substrate, the scan line extending along a first direction; a common power line disposed on the first surface of the substrate, the common power line extending along a second direction crossing the first direction; a thin film transistor connected to the scan line and the common power line; a sensing electrode connected to the thin film transistor; a first lens disposed on the sensing electrode and protruding in a direction away from the sensing electrode; and a first light blocking layer disposed on the sensing electrode and surrounding the first lens. The display unit includes: a base substrate; an organic light emitting element disposed on the base substrate; a thin film encapsulation layer disposed on the organic light emitting element; a second lens disposed on the thin film encapsulation layer and protruding in a direction away from the thin film encapsulation layer; and a second light blocking layer disposed on the thin film encapsulation layer and surrounding the second lens.

In an exemplary embodiment of the present invention, the first lens may overlap the second lens.

In an exemplary embodiment of the present invention, the first lens may have a shape substantially the same as a shape of the second lens.

In an exemplary embodiment of the present invention, each of the first lens and the second lens may have a refractive index in a range from about 1.60 to about 1.80.

In an exemplary embodiment of the present invention, the first lens and the second lens may include a plurality of first lenses and a plurality of second lenses, respectively, wherein the plurality of first lenses and the plurality of second lenses overlap the sensing electrode.

In an exemplary embodiment of the present invention, each of the first light blocking layer and the second light blocking layer may overlap at least part of the scan line, the common power line, the thin film transistor, and the sensing electrode.

In an exemplary embodiment of the present invention, the organic light emitting element may include: a first electrode; an organic light emitting layer disposed on the first electrode; and a second electrode disposed on the organic light emitting layer.

In an exemplary embodiment of the present invention, each of the first lens and the second lens may overlap the first electrode.

In an exemplary embodiment of the present invention, the display unit may further include a pixel defining layer disposed on the base substrate and including an opening that exposes at least a portion of the first electrode.

In an exemplary embodiment of the present invention, each of the first lens and the second lens may have an area larger than an area of the opening of the pixel defining layer.

In an exemplary embodiment of the present invention, the fingerprint sensing unit may further include a third lens disposed on the second surface of the substrate and protruding in a direction away from the substrate.

In an exemplary embodiment of the present invention, the third lens may overlap the first lens and the second lens, and have a refractive index in a range from about 1.60 to about 1.80.

In an exemplary embodiment of the present invention, the display device may further include a filler disposed between the display unit and the fingerprint sensing unit.

In an exemplary embodiment of the present invention, the filler may have a refractive index in a range from about 1.40 to about 1.60.

In an exemplary embodiment of the present invention, the display device may further include: a window disposed on the fingerprint sensing unit; and an adhesive layer disposed between the fingerprint sensing unit and the window.

In an exemplary embodiment of the present invention, the adhesive layer may have a refractive index in a range from about 1.40 to about 1.60.

BRIEF DESCRIPTION OF THE DRAWINGS

A more complete appreciation of the present invention and many of the attendant aspects thereof will be readily obtained as the same becomes better understood by reference to the following detailed description when considered in connection with the accompanying drawing, wherein.

DETAILED DESCRIPTION OF THE EMBODIMENTS

Figure 1:
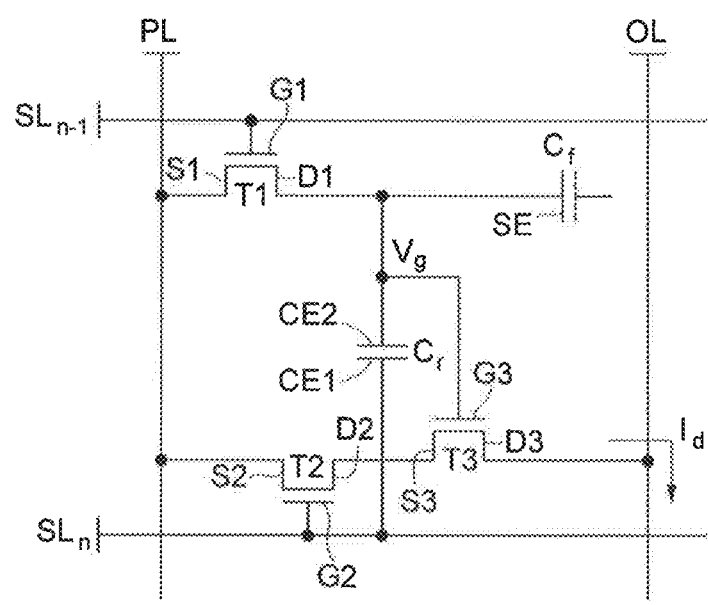
FIG. 1 is a circuit diagram illustrating a fingerprint sensing unit according to an exemplary embodiment of the present invention.

Exemplary embodiments of the present invention will now be described more fully hereinafter with reference to the accompanying drawings. However, the scope of the present invention is not limited to the following exemplary embodiments, but may be implemented in various different forms. It is to be understood that the same reference symbols may refer to the same components.

In the drawings, sizes of elements may be exaggerated for clarity. In other words, since sizes and thicknesses of components in the drawings may be exaggerated for clarity, the following exemplary embodiments of the present invention are not limited thereto. When an element, layer, area, or plate is referred to as being "on" another element, layer, area, or plate, it may be directly on the other element, layer, area, or plate, or intervening element, layers, areas, or plates may be present therebetween.

The spatially relative terms "below", "beneath", "lower", "above", "upper" or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, in the example, the illustrative term "below" may encompass both the orientations of above, below and beneath. The device may also be oriented in another direction (e.g., rotated 90 degrees or at other orientations), and thus the spatially relative terms may be interpreted differently depending on the orientations.

It will be understood that when an element is referred to as being "connected" or "coupled" to another element, the element may be directly connected or coupled to the other element or intervening elements.

It will be understood that, although the terms "first," "second," "third," or the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the spirit and scope of the present invention.

Hereinafter, a fingerprint sensing unit according to an exemplary embodiment of the present invention will be described with reference to FIGS. 1 to 5.

FIG. 1 is a circuit diagram illustrating a fingerprint sensing unit according to an exemplary embodiment of the present invention.

Referring to FIG. 1, a fingerprint sensing unit according to an exemplary embodiment of the present invention includes a plurality of thin film transistors T1, T2, and 13, a plurality of wirings SLn−1, SLn, PL, and OL connected to the plurality of thin film transistors T1, T2, and T3, and a reference capacitor Cr.

The plurality of thin film transistors T1, T2, and T3 include a first thin film transistor T1, a second thin film transistor 12, and a third thin film transistor T3.

A first gate electrode G1 of the first thin film transistor T1 is connected to a first scan line SLn−1, a first source electrode S1 of the first thin film transistor T1 is connected to a common power line PL, and a first drain electrode D1 of the first thin film transistor T1 is connected to a third gate electrode G3 of the third thin film transistor T3.

A second gate electrode G2 of the second thin film transistor T2 is connected to a second scan line SLn, a second source electrode S2 of the second thin film transistor T2 is connected to the common power line PL, and a second drain electrode D2 of the second thin film transistor 12 is connected to a third source electrode S3 of the third thin film transistor T3.

The third gate electrode G3 of the third thin film transistor T3 is connected to the first drain electrode D1 of the first thin film transistor T1, the third source electrode S3 of the third thin film transistor T3 is connected to the second drain electrode D2 of the second thin film transistor T2, and a third drain electrode D3 of the third thin film transistor T3 is connected to an output line OL.

As described above, the fingerprint sensing unit includes the first scan line SLn−1 for transmitting a first scan signal to the first gate electrode G1 of the first thin film transistor T1, the second scan line SLn for transmitting a second scan signal to the second gate electrode G2 of the second thin film transistor T2, the common power line PL for transmitting a driving voltage to the first source electrode S1 of the first thin film transistor T1 and the second source electrode S2 of the second thin film transistor T2, and the output line OL for transmitting a driving current Id that flows through the third thin film transistor T3 to a sensing driver.

The reference capacitor Cr includes one electrode (e.g., a first electrode) CE1 connected to the second scan line SLn, and another electrode (e.g., a second electrode) CE2 connected to the first drain electrode D1 of the first thin film transistor T1, the third gate electrode G3 of the third thin film transistor T3, and a sensing electrode SE.

Hereinafter, the driving of the fingerprint sensing unit will be described by way of example.

First, when the first scan signal is transmitted to the first scan line SLn−1 and the driving voltage is applied to the common power line PL, the first thin film transistor T1 is turned on. As an example, the first scan signal may be a pulse signal. For example, the first scan signal may correspond to a low voltage switching period of a signal held at a high voltage, or may correspond to a high voltage switching period of a signal held at a low voltage.

When the first thin film transistor T1 is turned on, the driving voltage of the common power line PL is transmitted to the third gate electrode G3 of the third thin film transistor T3 and the second electrode CE2 of the reference capacitor Cr through the first thin film transistor T1. Accordingly, the voltage is applied to the third gate electrode G3 of the third thin film transistor T3 and the second electrode CE2 of the reference capacitor Cr, and the third thin film transistor T3 is turned on.

When the second scan signal is transmitted to the second scan line SLn and the driving voltage is applied to the common power line PL, the second thin film transistor T2 is turned on. Similar to the first scan signal, the second scan signal may be a pulse signal.

When the second thin film transistor T2 is turned on and a gate voltage Vg is applied to the third gate electrode G3 of the third thin film transistor T3, then the driving current Id flows through the second thin film transistor T2 and the third thin film transistor T3. In present embodiment, the gate voltage Vg varies depending on a fingerprint capacitance Cf that is formed when a touch or a fingerprint contact is made. For example, the gate voltage Vg of the third gate electrode G3 varies depending on capacitive coupling between the fingerprint capacitance Cf and the reference capacitance Cr. In addition, the driving current Id flowing through the second thin film transistor T2 and the third thin film transistor T3 varies depending on the gate voltage Vg of the third gate electrode G3.

The output line OL transmits the driving current Id to the sensing driver. The sensing driver may detect whether a touch input occurs, determine touch coordinates, ridges and valleys of fingerprints according to an amount of change in the driving current Id after flowing through the third thin film transistor T3.

However, the structure of the fingerprint sensing unit according to an exemplary embodiment of the present invention is not limited thereto. The fingerprint sensing unit may include a plurality of thin film transistors, one or more capacitors, and wirings including one or more scan lines and one or more power lines.

Figure 2:
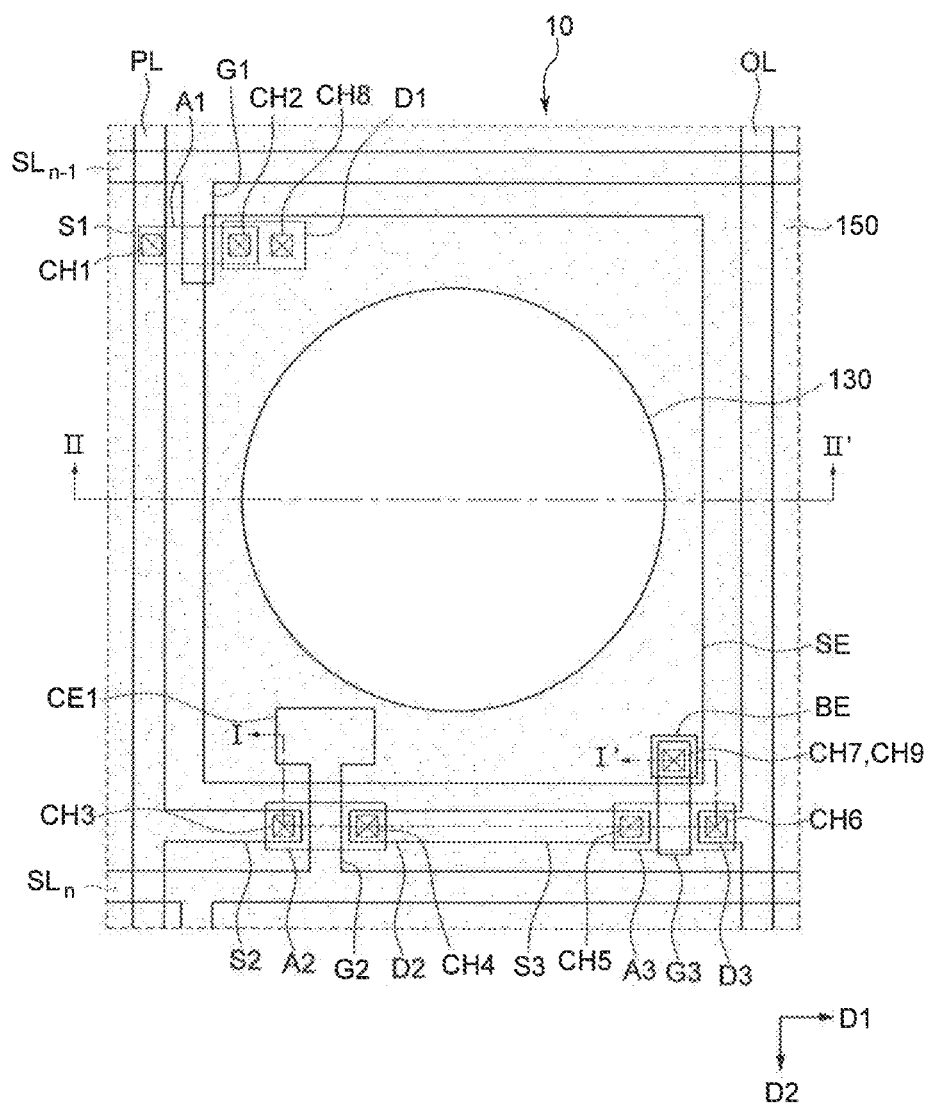
FIG. 2 is a plan view illustrating a part of a fingerprint sensing unit according to an exemplary embodiment of the present invention.
Figure 3:
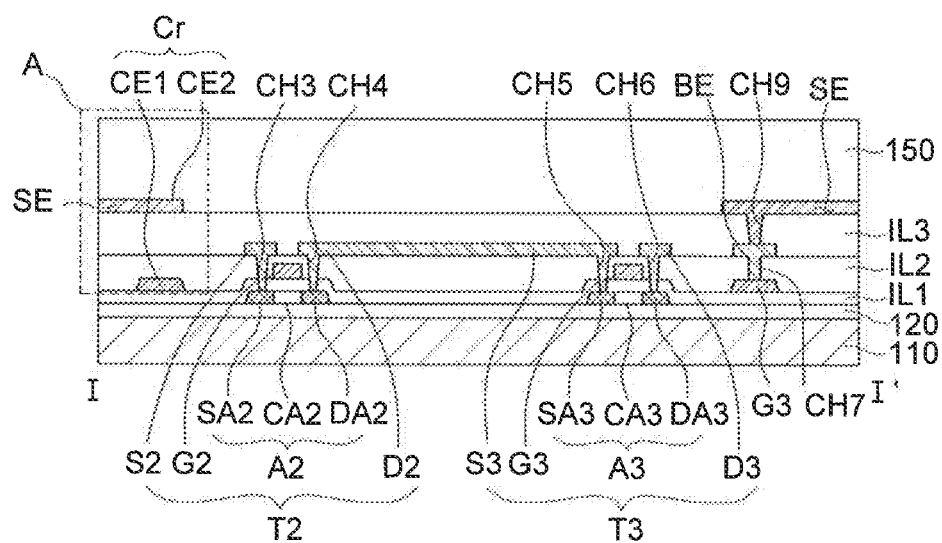
FIG. 3 is a cross-sectional view taken along line I-I' of FIG. 2.
Figure 4:
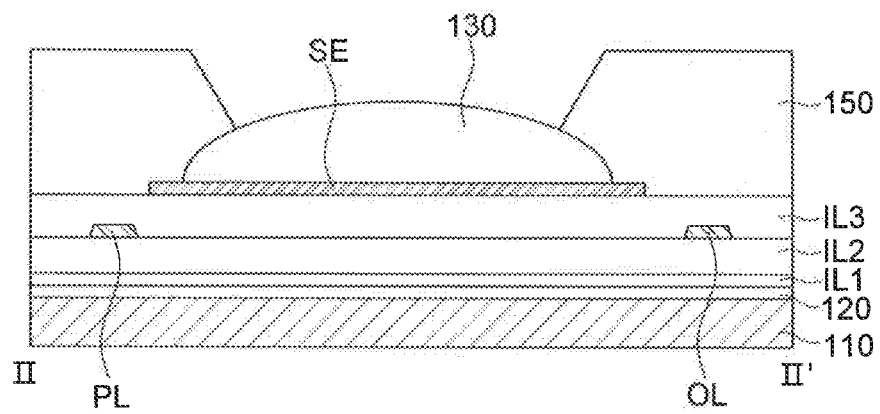
FIG. 4 is a cross-sectional view taken along line II-II' of FIG. 2.

FIG. 2 is a plan view illustrating a part of a fingerprint sensing unit according to an exemplary embodiment of the present invention, FIG. 3 is a cross-sectional view taken along line I-I' of FIG. 2, and FIG. 4 is a cross-sectional view taken along line II-II' of FIG. 2.

Referring to FIGS. 2, 3, and 4, the fingerprint sensing unit 10 according to an exemplary embodiment of the present invention includes a substrate 110. The fingerprint sensing unit 10 further includes first, second, and third thin film transistors T1, T2, and T3, first and second scan lines SLn−1 and SLn, a common power line PL, an output line OL, a sensing electrode SE, a buffer layer 120, first, second, and third insulating layers IL1, IL2, and IL3, a first lens 130, and a first light blocking layer 150 disposed on the substrate 110. In the present embodiment, the first, second, and third thin film transistors T1, T2, and T3 include first, second, and third gate electrodes G1, G2 and G3, first, second, and third source electrodes S1, S2 and S3, first, second, and third drain electrodes D1, D2, and D3, and first, second, and third active layers A1, A2, and A3, respectively.

The substrate 110 may be a plastic film having flexible characteristics. For example, the substrate 110 may include polyimide. However, exemplary embodiments of the present invention are not limited thereto, and for example, the substrate 110 may include an insulating material such as glass or quartz. The substrate 110 may include a material selected from materials with relatively high mechanical strength, thermal stability, transparency, surface smoothness, ease of handling, and water resistance.

The buffer layer 120 is disposed on the substrate 110. The buffer layer 120 may prevent penetration of impurities and may planarize the surface, and the buffer layer 120 may include various materials capable of providing the aforementioned functions. For example, the buffer layer 120 may include one of silicon nitride ($SiN_x$), silicon oxide ($SiO_2$), and/or silicon oxynitride ($SiO_xN_y$). However, the buffer layer 120 may be omitted.

The first active layer A1, the second active layer A2, and the third active layer A3 are disposed on the buffer layer 120. The first, second, and third active layers A1, A2, and A3 include a semiconductor material. The first active layer A1 includes a first source area, a first drain area, and a first channel area disposed between the first source area and the first drain area. The second active layer A2 includes a second source area SA2, a second drain area DA2, and a second channel area CA2 disposed between the second source area SA2 and the second drain area DA2. The third active layer A3 includes a third source area SA3, a third drain area DA3, and a third channel area CA3 disposed between the third source area SA3 and the third drain area DA3.

The first, second, and third active layers A1, A2, and A3 may include amorphous silicon, polycrystalline silicon, oxide semiconductor, or the like. The oxide semiconductor may include at least one of oxides based on titanium (Tl), hafnium (Hf), zirconium (Zr), aluminum (Al), tantalum (Ta), germanium (Ge), zinc (Zn), gallium (Ga), tin (Sn), or indium (In), or composite oxides thereof such as zinc oxide (ZnO), indium-gallium-zinc oxide ($InGaZnO_4$), indium-zinc oxide (Zn-n-O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (n-Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and/or hafnium-indium-zinc oxide (Hf—In—Zn—O). In the case where the first, second, and third active layers A1, A2, and A3 include an oxide semiconductor, a separate protective layer may be additionally provided to protect the oxide semiconductor from an external environment such as a high temperature.

The first, second, and third source areas SA2 and SA3 are respectively spaced apart from the first, second, and third drain areas DA2 and DA3 with the first, second, and third channel areas CA2 and CA3 disposed therebetween, respectively. For example, the first, second, and third source areas SA2, and SA3 and the first, second, and third drain areas DA2, and DA3 may be formed by doping a semiconductor material with an n-type impurity or a p-type impurity.

The first insulating layer IL1 is disposed on the first, second, and third active layers A1, A2, and A3. The first insulating layer IL1 may be a gate insulating layer. The first insulating layer IL1 may include one of silicon nitride (SiN$_x$), silicon oxide (SiO$_2$), and/or silicon oxynitride (SiO$_x$N$_y$).

The first gate electrode G1, the second gate electrode G2, and the third gate electrode G3 are disposed on the first insulating layer IL1. The first, second, and third gate electrodes G1, G2 and G3 overlap the first, second, and third active layers A1, A2 and A3, respectively. For example, the first, second, and third gate electrodes G1, G2 and G3 may be overlapping the first, second, and third channel areas CA2 and CA3, respectively.

In addition, the first scan line SLn−1, the second scan line SLn, and the first electrode CE1 of the reference capacitor Cr may be disposed on the first insulating layer IL1. The first scan line SLn−1 and the second scan line SLn are disposed on the substrate 110 extending along a first direction D1. The first electrode CE1 of the reference capacitor Cr may be formed unitarily with the second gate electrode G2. For example, the first electrode CE1 and second gate electrode G2 may be formed from substantially the same material. However, the present invention is not limited thereto.

The second insulating layer IL2 is disposed on the first, second, and third gate electrodes G1, G2 and G3, the first and second scan lines SLn−1 and SLn, and the first electrode CE1 of the reference capacitor Cr. The second insulating layer IL2 may be an organic insulating layer or an inorganic insulating layer such as silicon nitride (SiN$_x$), silicon oxide (SiO$_2$), and/or silicon oxynitride (SiO$_x$N$_y$).

The first, second, and third source electrodes S1, S2 and S3 and the first, second, and third drain electrodes D1, D2 and D3 are disposed on the second insulating layer IL2. The first source electrode S1 contacts the first source area of the first active layer A1 through a first contact hole CH1 penetrating the first insulating layer IL1 and the second insulating layer IL2. The first drain electrode D1 contacts the first drain area of the first active layer A1 through a second contact hole CH2 penetrating the first insulating layer IL1 and the second insulating layer IL2. The second source electrode S2 contacts the second source area SA2 of the second active layer A2 through a third contact hole CH3 defined in the first insulating layer IL1 and the second insulating layer IL2. The second drain electrode D2 contacts the second drain area DA2 of the second active layer A2 through a fourth contact hole CH4 penetrating the first insulating layer IL1 and the second insulating layer IL2. The third source electrode S3 contacts the third source area SA3 of the third active layer A3 through a fifth contact hole CH5 penetrating the first insulating layer IL1 and the second insulating layer IL2. The third drain electrode D3 contacts the third drain area DA3 of the third active layer A3 through a sixth contact hole CH6 penetrating the first insulating layer IL1 and the second insulating layer IL2.

In addition, the common power line PL, the output line OL, and a bridge electrode BE may be disposed on the second insulating layer IL2. The common power line PL and the output line OL are disposed on the substrate 110 extending along a second direction D2 which intersects the first direction D1. The bridge electrode BE contacts the third gate electrode G3 through a seventh contact hole CH7 penetrating the second insulating layer IL2.

The third insulating layer IL3 is disposed on the first, second, and third source electrodes S1, S2 and S3, the first, second, and third drain electrodes D1, D2 and D3, the common power line PL, the output line OL, and the bridge electrode BE. The third insulating layer IL3 may protect the first, second, and third thin film transistors T1, T2, and T3 from, for example, impurities and may planarize an upper surface thereof.

The third insulating layer IL3 may be an organic insulating layer or an inorganic insulating layer such as silicon nitride (SiN$_x$), silicon oxide (SiO$_2$), and/or silicon oxynitride (SiO$_x$N$_y$). For example, the third insulating layer IL3 may include a photosensitive polymer resin.

The sensing electrode SE is disposed on the third insulating layer IL3. The sensing electrode SE contacts the first drain electrode D1 of the first thin film transistor T1 through an eighth contact hole CH8 penetrating the third insulating layer IL3, and the sensing electrode SE contacts the bridge electrode BE connected to the third gate electrode G3 of the third thin film transistor T3 through a ninth contact hole CH9 penetrating the third insulating layer IL3.

The second electrode CE2 of the reference capacitor Cr is disposed on the third insulating layer IL3. The second electrode CE2 of the reference capacitor Cr may be formed unitarily with the sensing electrode SE. For example, the second electrode CE2 of the reference capacitor Cr and the sensing electrode SE may be formed in a substantially same process using a substantially same material.

The sensing electrode SE and the second electrode CE2 of the reference capacitor Cr may include metal or transparent conductive oxide (TCO). For example, the sensing electrode SE and the second electrode CE2 of the reference capacitor Cr may include an aluminum-based metal such as aluminum (Al) or an aluminum alloy, a silver-based metal such as silver (Ag) or a silver alloy, a copper-based metal such as copper (Cu) or a copper alloy, and/or a molybdenum-based metal such as molybdenum (Mo) or a molybdenum alloy. In addition, the sensing electrode SE and the second electrode CE2 of the reference capacitor Cr may include transparent conductive oxide (TCO), for example, at least one of indium tin oxide (ITO), indium zinc oxide (IZO), zinc oxide (ZnO), carbon nanotube (CNT), and/or graphene. In addition, each of the sensing electrode SE and the second electrode CE2 of the reference capacitor Cr may have a multilayer structure. However, the present invention is not limited thereto, and for example, the sensing electrode SE and the second electrode CE2 may each be a single layer structure.

The first lens 130 is disposed on the sensing electrode SE. The first lens 130 has a convex surface protruding in a direction away from the sensing electrode SE. For example, the first lens 130 may protrude in an upward direction away from an upper portion of the sensing electrode SE. The first lens 130 has a refractive index in a range from about 1.60 to about 1.80. For example, the first lens 130 may have a refractive index of about 1.65.

The first lens 130 may include, for example, a polymer organic material. polymer organic material may include at least one of an acrylic resin, an epoxy resin, polyimide, and/or polyethylene. For example, the first lens 130 may be an acrylic lens including an acrylic derivative or a high refractive index lens including high refractive index nanoparticles. In addition, the first lens 130 may be a color filter. However, exemplary embodiments of the present invention are not limited thereto, and the first lens 130 may include various materials.

The first lens 130 may correspond to a light emission area of a display device to be described below. For example, the first lens 130 may overlap the light emission area of the display device. Although the first lens 130 is illustrated as having a circular shape on a plane, exemplary embodiments of the present invention are not limited thereto, and the first lens 130 may have an elliptical shape, a polygonal shape, and/or an irregular shape on a plane, such as a shape that is partially polygonal and partially circular.

For example, a diameter of the first lens 130 may be in a range from about 10 μm to about 100 μm, and a height of the first lens 130 may be in a range from about 0.5 μm to about 10 μm. However, exemplary embodiments of the present invention are not limited thereto, and for example, the diameter and height of the first lens 130 may be variously designed in consideration of the size, resolution, or the like of the display device.

The first light blocking layer 150 is disposed on the sensing electrode SE and the third insulating layer IL3. The first light blocking layer 150 is disposed to surround the first lens 130 on a plane. The first light blocking layer 150 may overlap at least a part of the first lens 130. For example, the first light blocking layer 150 may include an opening overlapping the first lens 130. As an additional example, the first light blocking layer 150 may be disposed on a portion of the sensing electrode SE.

The first light blocking layer 150 is also called a black matrix, and may provide a light emission area. The first light blocking layer 150 may include a metal such as chromium oxide ($CrO_x$) or an opaque organic layer material.

Since the fingerprint sensing unit 10 according to an exemplary embodiment of the present invention includes the first lens 130 disposed on the sensing electrode SE, light emission efficiency of the display device including the fingerprint sensing unit 10 may be increased. In addition, since the fingerprint sensing unit 10 according to an exemplary embodiment of the present invention includes the first light blocking layer 150 surrounding the first lens 130, external light reflection may be substantially prevented. Accordingly, a separate polarizing plate for preventing reflection of external light may be omitted, and a moire phenomenon may be substantially prevented by reducing the thickness of the display device, which will be described in detail below.

Figure 5:
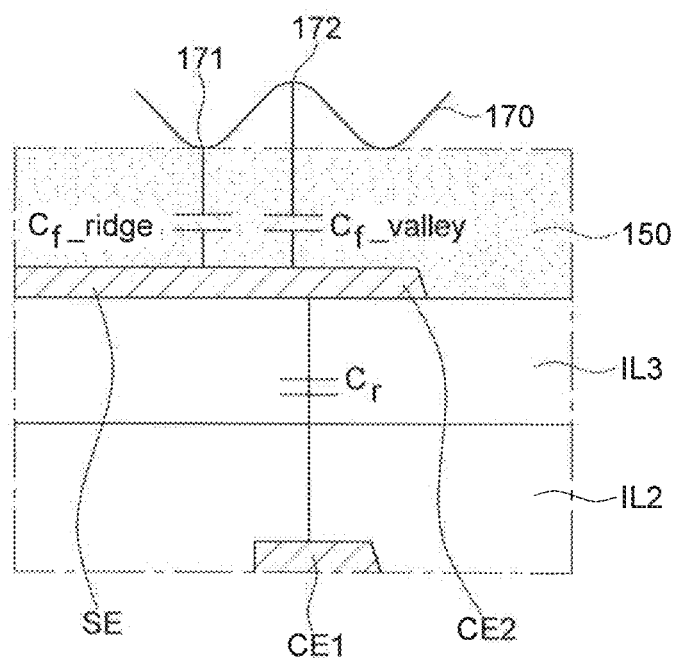
FIG. 5 is a cross-sectional view enlarging area A of FIG. 3.

FIG. 5 is a cross-sectional view enlarging area A of FIG. 3.

Referring to FIG. 5, a fingerprint 170 includes a ridge 171 and a valley 172, thereby causing a difference in distance from the sensing electrode SE. For example, a distance between the ridge 171 and the sensing electrode SE is less than a distance between the valley 172 and the sensing electrode SE. Such a difference in distance may causes a difference between a fingerprint capacitance Cf_ridge, which is between the ridge 171 and the sensing electrode SE, and a fingerprint capacitance Cf_valley, which is between the valley 172 and the sensing electrode SE.

As described above, the gate voltage Vg of the third gate electrode G3 based on capacitive coupling between the fingerprint capacitance Cf and the reference capacitance Cr varies depending on the difference of the fingerprint capacitance Cf. In addition, a driving current Id flowing through the second thin film transistor T2 and the third thin film transistor T3 varies depending on the gate voltage Vg of the third gate electrode G3. A sensing driver may detect whether a touch input occurs, determine touch coordinates, ridges and valleys of fingerprints according to an amount of change in the driving current Id.

Hereinafter, a fingerprint sensing unit according to an exemplary embodiment of the present invention will be described with reference to FIGS. 6 and 7. The description of components that may be similar to those of an exemplary embodiment of the present invention may be omitted for the sake of convenience.

Figure 6:
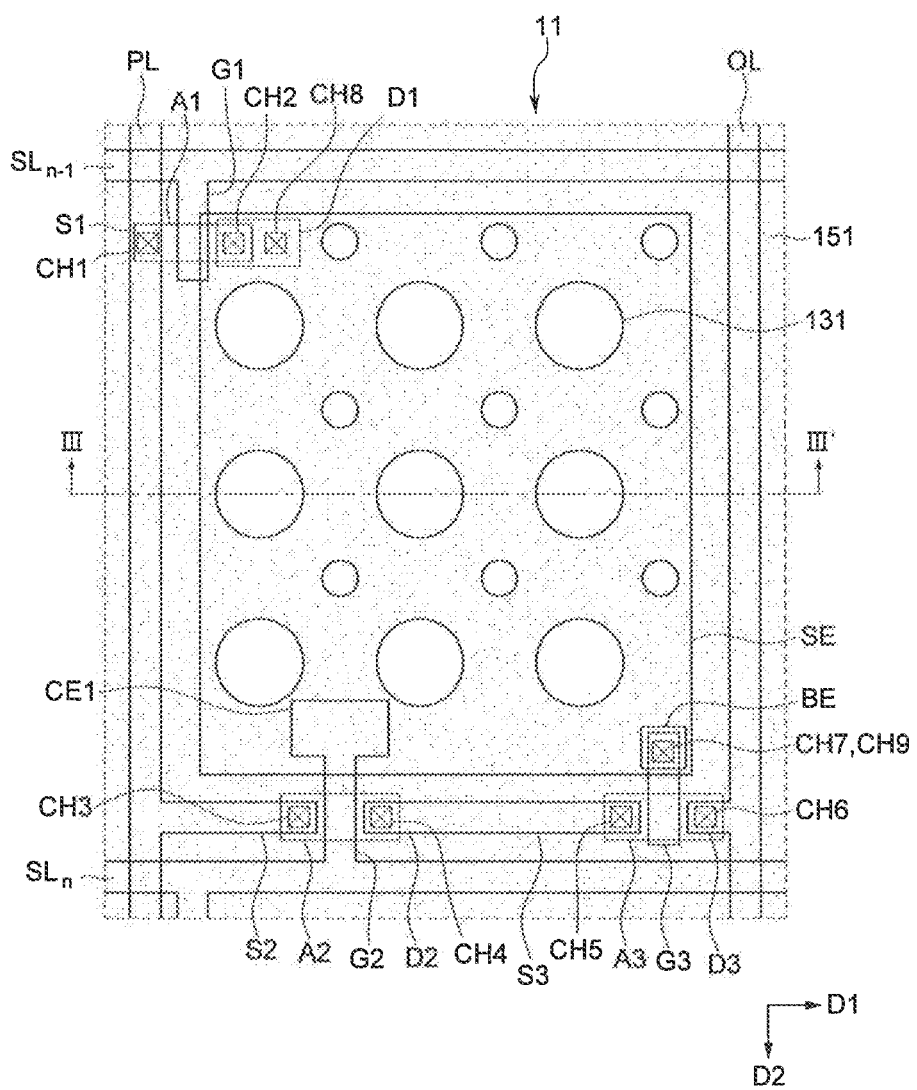
FIG. 6 is a plan view illustrating a part of a fingerprint sensing unit according to an exemplary embodiment of the present invention.
Figure 7:
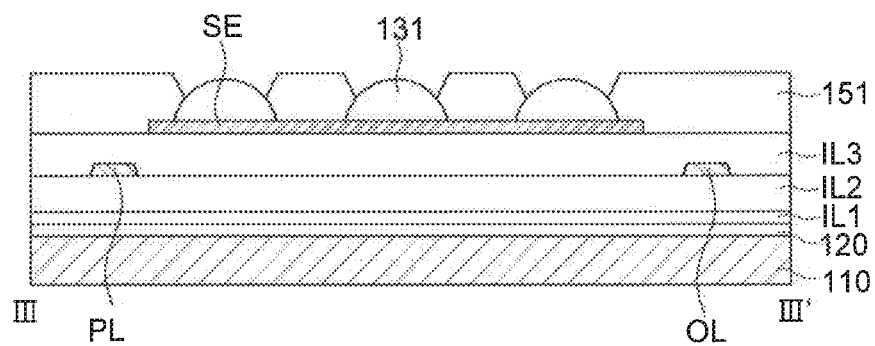
FIG. 7 is a cross-sectional view taken along line III-III' of FIG. 6.

FIG. 6 is a plan view illustrating a part of a fingerprint sensing unit according to an exemplary embodiment of the present invention, and FIG. 7 is a cross-sectional view taken along line III-III' of FIG. 6.

Referring to FIGS. 6 and 7, a fingerprint sensing unit 11 according to an exemplary embodiment of the present invention includes a plurality of first lenses 131 overlapping the sensing electrode SE. Each of the plurality of first lenses 131 has a convex surface protruding in a direction away from the sensing electrode SE. Each of the plurality of first lenses 131 may correspond to a light emission area of a display device. Accordingly, each first lens of the plurality of first lenses 131 may have a different size from one another depending on the area of the light emission area of the display device. However, exemplary embodiments of the present invention are not limited thereto, and for example, the plurality of first lens 131 may have the same size as one another. Each of the plurality of first lenses 131 is illustrated as having a circular shape on a plane. However, exemplary embodiments of the present invention are not limited thereto, and each of the plurality of first lenses 131 may have an elliptical shape, a polygonal shape, and/or an irregular shape on a plane.

Each of the plurality of first lenses 131 has a refractive index in a range from about 1.60 to about 1.80. For example, each of the plurality of first lenses 131 has a refractive index of about 1.65. In addition, a diameter of each of the plurality of first lenses 131 may be in a range from about 10 μm to about 100 μm, and a height of each of the plurality of first lenses 131 may be in a range from about 0.5 μm to about 10 μm. However, exemplary embodiments of the present invention are not limited thereto, and the diameter and height of the plurality of first lenses 130 may be variously designed in consideration of the size, resolution, or the like of the display device.

A first light blocking layer 151 is disposed on the sensing electrode SE and a third insulating layer IL3. The first light blocking layer 151 is disposed to surround the plurality of first lenses 131 on a plane. The first light blocking layer 151 may overlap at least a part of the plurality of first lenses 131.

For example, the light blocking layer 151 may cover at least a portion of each first lens of the plurality of first lens 131, and may include a plurality of openings that exposes at least a portion of each first lens of the plurality of first lens 131.

Since the fingerprint sensing unit 11 according to an exemplary embodiment of the present invention includes the plurality of first lenses 131 disposed on the sensing electrode SE, light emission efficiency of the display device including the fingerprint sensing unit 11 may be increased. In addition, since the fingerprint sensing unit 11 according to an exemplary embodiment of the present invention includes the first light blocking layer 151 surrounding the first lens 131, external light reflection may be substantially prevented. Accordingly, a separate polarizing plate for preventing reflection of external light may be omitted, and a moire phenomenon may be substantially prevented by reducing the thickness of the display device, which will be described in detail below.

Hereinafter, a display device according to an exemplary embodiment of the present invention will be described with reference to FIGS. 8 to 11. The description of components that may be similar to those of an exemplary embodiment of the present invention described above may be omitted for the sake of convenience.

Figure 8:
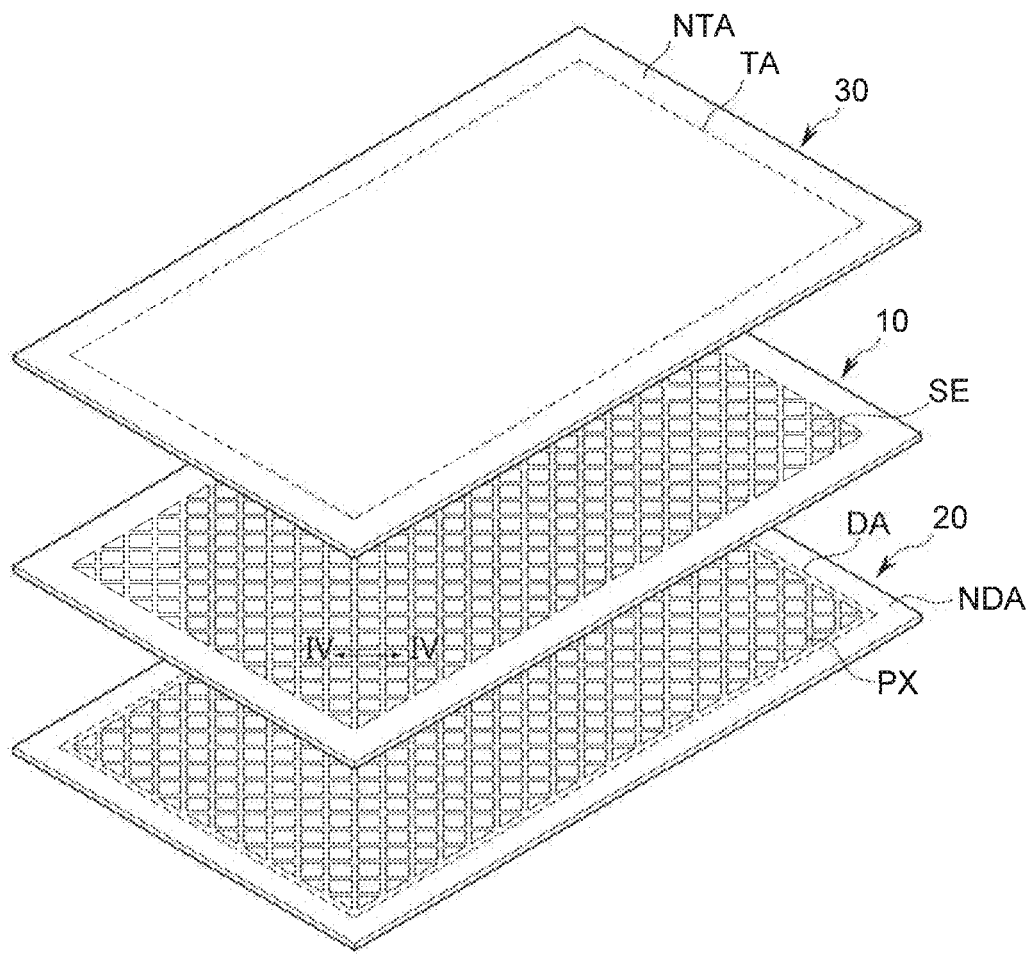
FIG. 8 is a perspective view illustrating a display device according to an exemplary embodiment of the present invention.
Figure 9:
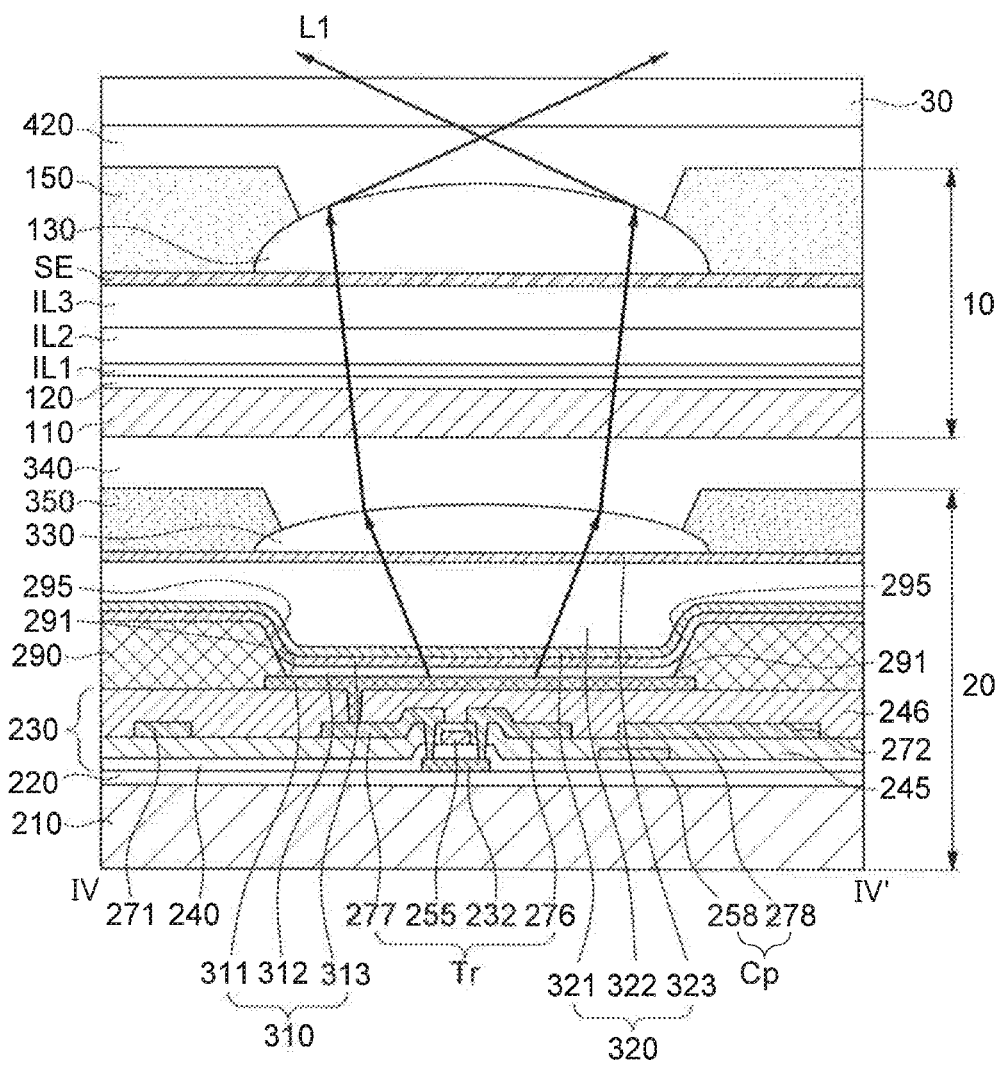
FIG. 9 is a cross-sectional view taken along line IV-IV' of FIG. 8.
Figure 10:
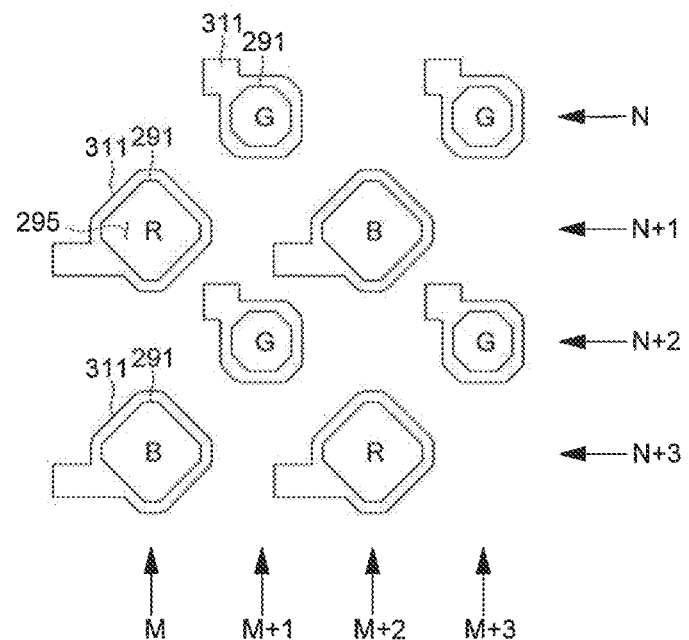
FIG. 10 is a plan view schematically illustrating a plurality of first electrodes and a plurality of openings according to an exemplary embodiment of the present invention.
Figure 11:
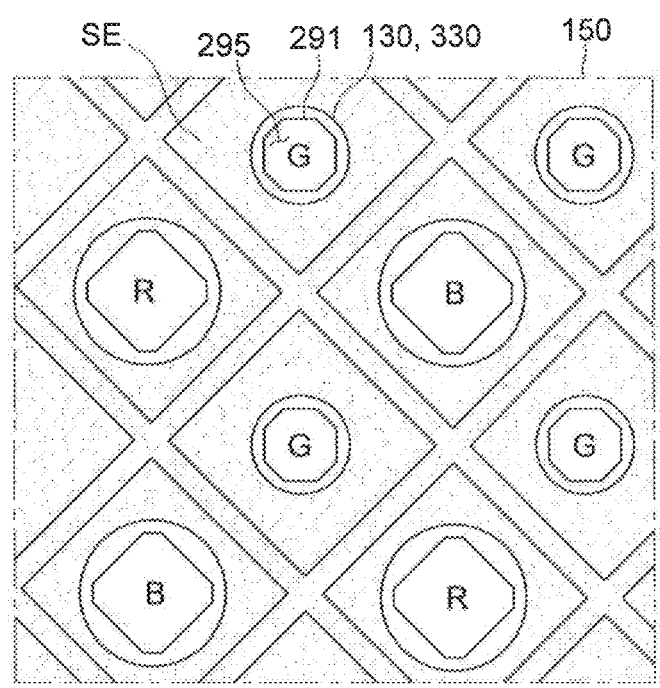
FIG. 11 is a plan view illustrating a plurality of openings, pluralities of first and second lenses, a plurality of sensing electrodes, and a light blocking layer according to an exemplary embodiment of the present invention.

FIG. 8 is a perspective view illustrating a display device according to an exemplary embodiment of the present invention, FIG. 9 is a cross-sectional view taken along line IV-IV' of FIG. 8, FIG. 10 is a plan view schematically illustrating a plurality of first electrodes and a plurality of openings according to an exemplary embodiment of the present invention, and FIG. 11 is a plan view illustrating a plurality of openings, pluralities of first and second lenses, a plurality of sensing electrodes, and a light blocking layer according to an exemplary embodiment of the present invention.

Referring to FIG. 8, the display device includes a fingerprint sensing unit 10, a display unit 20, and a window 30. In the present embodiment, although the fingerprint sensing unit 10 and the display unit 20 are illustrated separately from each other, the fingerprint sensing unit 10 and the display unit 20 may be unitarily formed. For example, the display device will be described on the premise that the fingerprint sensing unit 10 has an on-cell structure in which it is directly disposed on the display unit 20. However, exemplary embodiments of the present invention are not limited thereto, and the fingerprint sensing unit 10 may have an in-cell structure in which it is formed in the display unit 20. In addition, the display device may be an organic light emitting diode ("OLED") display device, but exemplary embodiments of the present invention are not limited thereto, and for example, the display device may be a liquid crystal display ("LCD") device.

The fingerprint sensing unit 10 will be described on the assumption that it is the fingerprint sensing unit 10 illustrated in FIGS. 1 to 5. In other words, the fingerprint sensing unit 10 includes a substrate 110, first to third thin film transistors T1, T2, and T3, first and second scan lines SLn−1 and SLn, a common power line P1, an output line OL, a sensing electrode SE, a buffer layer 120, first to third insulating layers IL1, IL2 and IL3, a first lens 130, and a light blocking layer 150 disposed on the substrate 110.

The display unit 20 may be divided into a display area DA and a non-display area NDA. The display unit 20 includes a plurality of pixels PX arranged in a matrix form in the display area DA. The plurality of pixels PX may have a quadrilateral shape. For example, the plurality of pixels PX may have a substantially rhombic shape, but exemplary embodiments of the present invention are not limited thereto, and the plurality of pixels PX may have various shapes such as substantially circular or polygonal shapes.

The fingerprint sensing unit 10 is disposed on the display unit 20. The fingerprint sensing unit 10 includes a plurality of sensing electrodes SE for detecting whether a touch input occurs, touch coordinates, ridges and valleys of fingerprints. For example, as illustrated in FIG. 8, the fingerprint sensing unit 10 may include the plurality of sensing electrodes SE disposed over an entire surface of a substrate overlapping the display unit 20. Accordingly, a touch or a fingerprint may be sensed over an entire surface of the display device.

The window 30 is disposed on the fingerprint sensing unit 10. The window 30 may protect the fingerprint sensing unit 10 and the display unit 20 from external scratches. The window 30 may be divided into a transmission area TA and a non-transmission area NTA. The transmission area TA may be located to correspond to the display area DA of the display unit 20, and the non-transmission area NTA may be located to correspond to the non-display area NDA of the display unit 20. For example, the transmission area TA may overlap the display area DA, and the non-transmission area NTA may overlap the non-display area NDA. As an additional example, the non-transmission area NTA may be located at an edge of the window 30. Further, the non-transmission area NTA may at least partially surround the transmission area TA.

The window 30 may include at least one of glass, sapphire, diamond, polymethylmethacrylate (PMMA), and/or polycarbonate (PC). Accordingly, light emitted from the display unit 20 may be viewed by the user through the transmission area TA of the window 30.

Referring to FIG. 9, the display unit 20 includes a base substrate 210, a driving circuit unit 230, a pixel defining layer 290, an OLED 310, a thin film encapsulation layer 320, a second lens 330, and a second light blocking layer 350.

A buffer layer 220 is disposed on the base substrate 210. The buffer layer 220 may prevent permeation of undesirable elements and planarize a surface there below, and the buffer layer 220 may include various materials capable of performing the aforementioned functions. For example, the buffer layer 220 may include at least one of silicon nitride ($SiN_x$), silicon oxide ($SiO_2$), and/or silicon oxynitride ($SiO_xN_y$). However, the buffer layer 220 may be omitted.

The driving circuit unit 230 is disposed on the buffer layer 220. The driving circuit unit 230 corresponds to a portion including a plurality of thin film transistors Tr and capacitors Cp, and drives the OLED 310. In addition, the driving circuit unit 230 includes a gate line disposed along one direction, and a data line 271 and a common power line 272 insulated from and intersecting the gate line. The OLED 310 emits light according to a driving signal received from the driving circuit unit 230 to display images.

The display device according to an exemplary embodiment of the present invention may have a 2Tr-1Cap structure in which two thin film transistors Tr and one capacitor Cp are provided in one pixel PX, or may have various structures including three or more thin film transistors Tr and two or more capacitors Cp in one pixel PX.

The capacitor Cp includes a pair of electrodes 258 and 278 with an insulating interlayer 245 interposed therebetween. In the present embodiment, the insulating interlayer 245 may be a dielectric element. A capacitance of the capacitor Cp may be determined by electric charges accumulated in the capacitor Cp and a voltage between the two electrodes 258 and 278.

The thin film transistor Tr includes a semiconductor layer 232, a gate electrode 255, a source electrode 276 and a drain electrode 277. The semiconductor layer 232 may be insulated from the gate electrode 255 by a gate insulating layer 240. The thin film transistor Tr applies, to a first electrode 311, a driving power for an organic light emitting layer 312 of the OLED 310 in a selected pixel PX to emit light. In the present embodiment, the gate electrode 255 is connected to one electrode (e.g., a first electrode) 258 of the capacitor Cp, each of the source electrode 276 and another electrode (e.g., a second electrode) 278 of the capacitor Cp is connected to the common power line 272, and the drain electrode 277 is connected to the first electrode 311 of the OLED 310 through a contact hole penetrating a planarization layer 246.

The planarization layer 246 is disposed on the insulating interlayer 245. The planarization layer 246 includes an insulating material and may protect the driving circuit unit 230. The planarization layer 246 and the insulating interlayer 245 may include substantially the same material.

The first electrode 311 is disposed on the planarization layer 246. The first electrode 311 may be a pixel electrode and may be an anode. The first electrode 311 has conductivity and may be one of, for example, a transmissive electrode, a transflective electrode or a reflective electrode.

When the first electrode 311 is a transmissive electrode, the first electrode 311 may include a transparent conductive oxide (TCO). For example, at least one of indium tin oxide (ITO), indium zinc oxide (IZO), zinc oxide (ZnO) and/or indium tin zinc oxide (ITZO) may be used as TCO. When the first electrode 311 is a transflective electrode or a reflective electrode, the first electrode 311 may include at least one of Ag, Mg, Al, Pt, Pd, Au, Ni, Nd, Ir, Cr, and/or Cu.

The pixel defining layer 290 may be disposed on the planarization layer 246 and may divide a light emission area. In the present embodiment, the light emission area may also be referred to as a pixel area. The pixel defining layer 290 may include a polymer organic material. For example, the pixel defining layer 290 may include at least one of a polyimide (PI)-based resin, a polyacrylic resin, a PET resin, and/or a PEN resin.

The pixel defining layer 290 may include an opening 295 and at least a portion of the first electrode 311 is exposed by the pixel defining layer 290 through the opening 295. The first electrode 311 overlaps at least a portion of the pixel defining layer 290 and is partially exposed by the opening 295. The opening 295 may be an area that overlaps the first electrode 311 and does not overlap the pixel defining layer 290. The opening 295 may correspond to a light emission area. In addition, a boundary at which the pixel defining layer 290 contacts the first electrode 311 at the opening 295 is an edge 291 of the opening 295.

Referring to FIG. 10, the pixel defining layer 290 includes the plurality of openings 295 respectively corresponding to the plurality of pixels PX. The plurality of pixels PX include a red pixel R for emitting red light, a green pixel G for emitting green light, and a blue pixel B for emitting blue light. In the present embodiment, the OLED 310 of the red pixel R includes a red light emitting layer, the OLED 310 of the green pixel G includes a green light emitting layer, and the OLED 310 of the blue pixel B includes a blue light emitting layer. However, exemplary embodiments of the present invention are not limited thereto, and the plurality of pixels PX may include pixels each emitting light having cyan, magenta, or yellow colors.

The edges 291 of the plurality of openings 295 may each have a shape similar to that of the first electrode 311 on a plane. For example, as illustrated in FIG. 10, each of the edge 291 of the opening 295 and the first electrode 311 may have a substantially octagonal shape similar to a rhombus on a plane.

In the present embodiment, each of the plurality of first electrodes 311 may correspond to the red pixel R, the green pixel G, and the blue pixel B and may have sizes different from each other on a plane. Similarly, each of the plurality of openings 295 may correspond to the red pixel R, the green pixel G, and the blue pixel B and may have sizes different from each other on a plane. For example, as illustrated in FIG. 10, the opening 295 and the first electrode 311 corresponding to the red pixel R may have size larger than the size of the opening 295 and the first electrode 311 corresponding to the green pixel G, respectively, and may have a size less than or substantially equal to the size of the opening 295 and the first electrode 311 corresponding to the blue pixel B, respectively. However, exemplary embodiments of the present invention are not limited thereto, and for example, each of the opening 295 and the first electrode 311 may have various sizes.

In addition, the display device according to an exemplary embodiment of the present invention may have a pentile structure. For example, as illustrated in FIG. 11, the plurality of first electrodes 311 corresponding to the green light emitting layer may be disposed apart from each other at a predetermined distance in an N-th row, and the first electrodes 311 corresponding to the red light emitting layer and the first electrodes 311 corresponding to the blue light emitting layer may be alternately disposed in an (N+1)-th row that is adjacent to the N-th row. Similarly, the plurality of first electrodes 311 corresponding to the green light emitting layer may be disposed apart from each other at a predetermined distance in an (N+2)-th row that is adjacent to the (N+1)-th row, and the first electrodes 311 corresponding to the red light emitting layer and the first electrodes 311 corresponding to the blue light emitting layer may be alternately disposed in an (N+3)-th row that is adjacent to the (N+2)-th row.

In addition, the first electrodes 311 corresponding to the plurality of green light emitting layers that are disposed in the N-th row may be disposed alternately with the first electrodes 311 corresponding to the plurality of red and blue light emitting layers that are disposed in the (N+1)-th row. For example, the first electrodes 311 corresponding to the red and blue light emitting layers may be alternately disposed in an M-th column, and the first electrodes 311 corresponding to the plurality of green light emitting layers may be disposed apart from each other at a predetermined distance in an (M+1)-th column which is adjacent to the M-th column. Similarly, the first electrodes 311 corresponding to the red and blue light emitting layers may be alternately disposed in an (M+2)-th column which is adjacent to the (M+1)-th column, and the first electrodes corresponding to the plurality of green light emitting layers may be disposed apart from each other at a predetermined distance in an (M+3)-th column which is adjacent to the (M+2)-th column. For example, the plurality of first electrodes 311 may be repeatedly disposed on the substrate 110 in the above-described structure.

The organic light emitting layer 312 is disposed on the first electrode 311. For example, the organic light emitting layer 312 is disposed at the opening 295 exposing the first electrode 311. As an additional example, the organic light emitting layer 312 may be disposed on the pixel defining layer 290, which includes the opening 295. For example, the organic light emitting layer 312 may be disposed on a sidewall of the pixel defining layer 290.

The organic light emitting layer 312 includes a light emitting material. In addition, the organic light emitting layer 312 may include a host and a light emitting dopant. The organic light emitting layer 312 may be manufactured in a known method, using a known material. For example, the organic light emitting layer 312 may be formed through various methods such as a vacuum deposition method, a spin coating method, a cast method, a Langmuir-blodgett (LB) method, an inkjet printing method, a laser printing method, a laser induced thermal imaging (LITI) method, or the like.

A second electrode 313 is disposed on the organic light emitting layer 312. The second electrode 313 may be a common electrode and may be a cathode. The second electrode 313 may be, for example, a transmissive electrode, a transflective electrode, or a reflective electrode.

When the second electrode 313 is a transmissive electrode, the second electrode 313 may include at least one of Li, Ca, LiF/Ca, LiF/Al, Al, Mg, BaF, Ba, Ag, and/or Cu. For example, the second electrode 313 may include a mixture of Ag and Mg. When the second electrode 313 is a transflective electrode or a reflective electrode, the second electrode 313 may include at least one of Ag, Mg, Al, Pt, Pd, Au, Ni, Nd, Ir, Cr, Li, Ca, LiF/Ca, LiF/Al, Mo, Ti and/or Cu. In addition, the second electrode 313 may further include a transparent conductive layer which includes, for example, indium tin oxide (ITO), indium zinc oxide (IZO), zinc oxide (ZnO), and/or indium-zinc-tin oxide (IZTO), in addition to the transflective electrode or the reflective electrode.

Although not illustrated, at least one of a hole injection layer (HIL) and a hole transport layer (HTL) may be disposed between the first electrode 311 and the organic light emitting layer 312, and at least one of an electron transport layer (ETL) and an electron injection layer (EIL) may be disposed between the organic light emitting layer 312 and the second electrode 313.

For example, when the OLED 310 is a top emission type, the first electrode 311 may be a reflective electrode and the second electrode 313 may be a transmissive electrode or a transflective electrode. As an additional example, when the OLED 310 is a bottom emission type, the first electrode 311 may be a transmissive electrode or a transflective electrode, and the second electrode 313 may be a reflective electrode. According to an exemplary embodiment of the present invention, the OLED 310 may be a top emission type, the first electrode 311 may be a reflective electrode, and the second electrode 313 may be a transflective electrode.

A thin film encapsulation layer 320 is disposed on the second electrode 313 to protect the OLED 310. The thin film encapsulation layer 320 may substantially prevent an outside air such as moisture, oxygen or other environmental elements from penetrating into the OLED 310.

The thin film encapsulation layer 320 includes at least one inorganic layer 321 and 323 and at least one organic layer 322 which is arranged alternately with the at least one inorganic layer 321 and 323. Referring to FIG. 9, the thin film encapsulation layer 320 according to an exemplary embodiment of the present invention is illustrated as including two inorganic layers 321 and 323 and one organic layer 322, but exemplary embodiments of the present are not limited thereto.

The inorganic layers 321 and 323 include one or more inorganic materials of: $Al_2O_3$, $TiO_2$, $ZrO$, $SiO_2$, AlON, AlN, SiON, $Si_3N_4$, ZnO, and/or $Ta_2O_5$. The inorganic layers 321 and 323 may be formed through methods such as a chemical vapor deposition (CVD) method or an atomic layer deposition (ALD) method. However, exemplary embodiments of the present invention are not limited thereto, and the inorganic layers 321 and 323 may be formed through various methods known to those skilled in the pertinent art.

The organic layer 322 may include a polymer-based material. Examples of the polymer-based material may include an acrylic resin, an epoxy resin, polyimide and polyethylene. The organic layer 322 may be formed through a thermal deposition process. The thermal deposition process for forming the organic layer 322 may be performed in a range of temperature that may not damage the OLED 310. However, exemplary embodiments of the present invention are not limited thereto, and for example, the organic layer 322 may be formed through various methods known to those skilled in the pertinent art.

The inorganic layers 321 and 323 which have a high density of thin film may substantially prevent or efficiently reduce permeation of moisture oxygen or other environmental elements. Permeation of moisture and oxygen into the OLED 310 may be prevented by the inorganic layers 321 and 323.

Moisture and oxygen that have passed through the inorganic layers 321 and 323 may be blocked by the organic layer 322. The organic layer 322 may have relatively low permeation prevention efficiency as compared to the inorganic layers 321 and 323. However, the organic layer 322 may also serve as a buffer layer to reduce stress between one of the inorganic layers 321 and 323 and another of the inorganic layers 321 and 323, in addition to the moisture permeation preventing function. Further, since the organic layer 322 has planarizing characteristics, an uppermost surface of the thin film encapsulation layer 320 may be planarized by the organic layer 322.

The second lens 330 is disposed on the thin film encapsulation layer 320. The second lens 330 has a convex surface protruding in a direction away from the thin film encapsulation layer 320. For example, the second lens 330 may protrude in an upward direction away from an upper surface of the thin film encapsulation layer 320. The second lens 330 has a refractive index, for example, in a range from about 1.60 to about 1.80. For example, the second lens 330 may have a refractive index of about 1.65.

The second lens 330 may include, for example, a polymer organic material. The polymer organic material may include at least one of, for example, an acrylic resin, an epoxy resin, polyimide, and/or polyethylene. For example, the second lens 330 may be an acrylic lens including an acryl derivative or a high refractive index lens including high refractive index nanoparticles. In addition, the second lens 330 may be a color filter. However, exemplary embodiments of the present invention are not limited thereto, and the second lens 330 may include various materials.

The second lens 330 overlaps the first electrode 311 of the OLED 310. For example, the second lens 330 is located on the first electrode 311 and at the opening 295 of the pixel defining layer 290. In addition, the second lens 330 overlaps the first lens 130. For example, the first lens 130, the second lens 330, and the first electrode 311 overlap each other and each are disposed in the light emission area of the OLED 310.

Referring to FIG. 11, the second lens 330 may have a shape substantially the same as a shape of the first lens 130 on a plane. For example, the first and second lenses 130 and 330 may have a circular shape on a plane. However, exemplary embodiments of the present invention are not limited thereto, and for example, the first and second lenses 130 and 330 may have an elliptical shape, a polygonal shape, and an irregular shape on a plane.

In addition, each of the first and second lenses 130 and 330 has an area larger than that of the opening 295 on a plane. Accordingly, a light L1 emitted from the OLED 310 may be prevented from being absorbed by the first light blocking layer 150 of the fingerprint sensing unit 10, thereby substantially minimizing the light loss. A diameter of the second lens 330 may be in a range from about 10 μm to about 100 μm, and a height of the second lens 330 may be in a range from about 0.5 μm to about 10 μm. However, exemplary embodiments of the present invention are not limited thereto, and the diameter and height of the second lens 330 may be variously designed in consideration of the size and resolution of the display device.

The second light blocking layer 350 is disposed on the thin film encapsulation layer 320. The light blocking layer 350 is disposed to surround the second lens 330 on a plane. The second light blocking layer 350 may overlap at least a portion of the second lens 330.

The second light blocking layer 350 may be referred to as a black matrix, and may provide the light emission area. The second light blocking layer 350 may include a metal such as chromium oxide ($CrO_x$) or an opaque organic layer material.

The fingerprint sensing unit 10 is disposed on the display unit 20 including the base substrate 210, the driving circuit unit 230, the pixel defining layer 290, the OLED 310, the thin film encapsulation layer 320, the second lens 330, and the second light blocking layer 350.

As described above, the fingerprint sensing unit 10 includes the substrate 110, the first, second, and third thin film transistors T1, T2, and T3, the first and second scan lines SLn−1 and SLn, the common power line PL, the output line OL, the sensing electrode SE, the buffer layer 120, the first, second, and third insulating layers IL1, IL2, and IL3, the first lens 130, and the first light blocking layer 150 disposed on the substrate 110.

A filler 340 is disposed between the fingerprint sensing unit 10 and the display unit 20. For example, the filler 340 may be disposed directly contacting the second lens 330, the second light blocking layer 350 of the display unit 20 and the substrate 110 of the fingerprint sensing unit 10. As an additional example, the filler may be disposed between the lower surface of the substrate 110 and the upper surfaces of the second light blocking layer 350 and the second lens 330. The filler 340 may include an organic material, for example, a polymer.

The filler 340 has a refractive index less than that of the second lens 330. The filler 340 may have a refractive index in a range from, for example, about 1.40 to about 1.60. For example, the second lens 330 may have a refractive index of about 1.65, and the filler 340 may have a refractive index of about 1.45. The light L1 emitted from the OLED 310 may be refracted at an interface between the second lens 330 having a relatively high refractive index and the filler 340 having a relatively low refractive index.

Accordingly, the linearity of the light L1 emitted from the OLED 310 may be increased. In addition, since the light L1 emitted from the OLED 310 may be prevented from being absorbed through the first light blocking layer 150 of the fingerprint sensing unit 10, the light loss may be minimized, and the light emission efficiency of the display device may be increased.

An adhesive layer 420 is disposed between the fingerprint sensing unit 10 and the window 30. The adhesive layer 420 may include an optically clear adhesive (OCA) to prevent the brightness of the light from lowering. In addition, the adhesive layer 420 may include a transparent polymer resin which is tacky and may be cured by light or heat. For example, the adhesive layer 420 may include a photo-curable resin that is cured by light irradiation.

The adhesive layer 420 has a refractive index less than that of the first lens 130. The adhesive layer 420 may have a refractive index in a range from, for example, about 1.40 to about 1.60. For example, the first lens 130 may have a refractive index of about 1.65, and the adhesive layer 420 may have a refractive index of about 1.45. The light L1 refracted at the interface between the second lens 330 and the filler 340 and incident to the fingerprint sensing unit 10 may be refracted once again at an interface between the first lens 130 having a relatively high refractive index and the adhesive layer 420 having a relatively low refractive index. Accordingly, light condensing efficiency for the light L1 emitted from the OLED 310 may be increased.

In addition, since the display device according to an exemplary embodiment of the present invention includes the first and second lenses 130 and 330 that overlap each other in the light emission area, the area of the first and second light blocking layers 150 and 350 may be substantially maximized. Accordingly, a separate polarizing plate for preventing reflection of external light may be omitted, and the moire phenomenon may be substantially prevented by reducing the thickness of the display device.

Hereinafter, a display device according to an exemplary embodiment of the present invention will be described with reference to FIG. 12. The description of components that may be similar to those of an exemplary embodiment of the present invention may be omitted for the sake of convenience.

Figure 12:
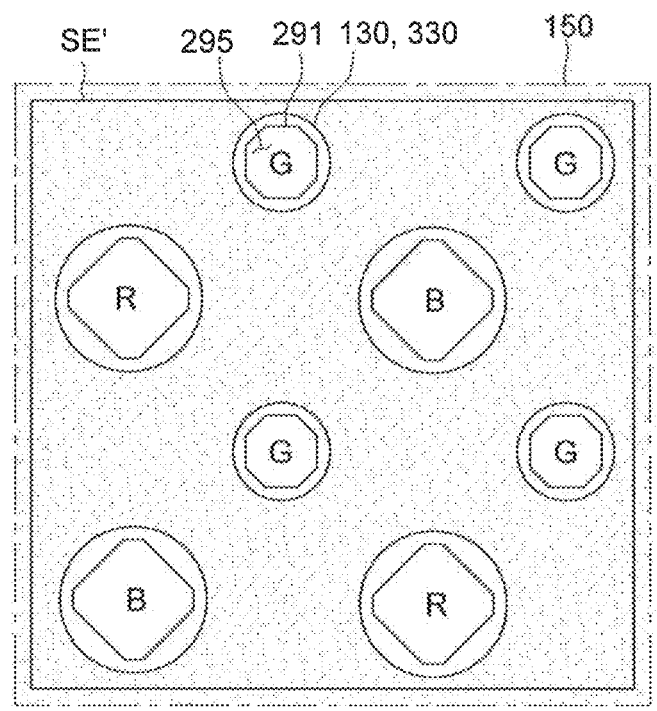
FIG. 12 is a plan view illustrating a plurality of openings, pluralities of first and second lenses, a sensing electrode, and a light blocking layer according to an exemplary embodiment of the present invention.

FIG. 12 is a plan view illustrating a plurality of openings, pluralities of first and second lenses, a sensing electrode, and a light blocking layer according to an exemplary embodiment of the present invention.

Referring to FIG. 12, dissimilar to the sensing electrode SE according to an exemplary embodiment of the present invention, the sensing electrode SE' according to an exemplary embodiment of the present invention may overlap pluralities of first and second lenses 130 and 330. In other words, dissimilar to an exemplary embodiment of the present invention in which one sensing electrode SE overlaps one first lens 130 and one second lens 330, one sensing electrode SE' according to an exemplary embodiment of the present invention may overlap a plurality of first lenses 130 and a plurality of second lenses 330.

Accordingly, the area of a plurality of wiring connected to the sensing electrode SE' may be reduced. In addition, since the wiring area of the fingerprint sensing unit 10 may be reduced, the reflection of external light by the wiring may be minimized, and the display quality of the display device may be increased.

Hereinafter, a display device according to an exemplary embodiment of the present invention will be described with reference to FIG. 13. The description of a configuration that may be similar to that of an exemplary embodiment of the present invention may be omitted for the convenience of explanation.

Figure 13:
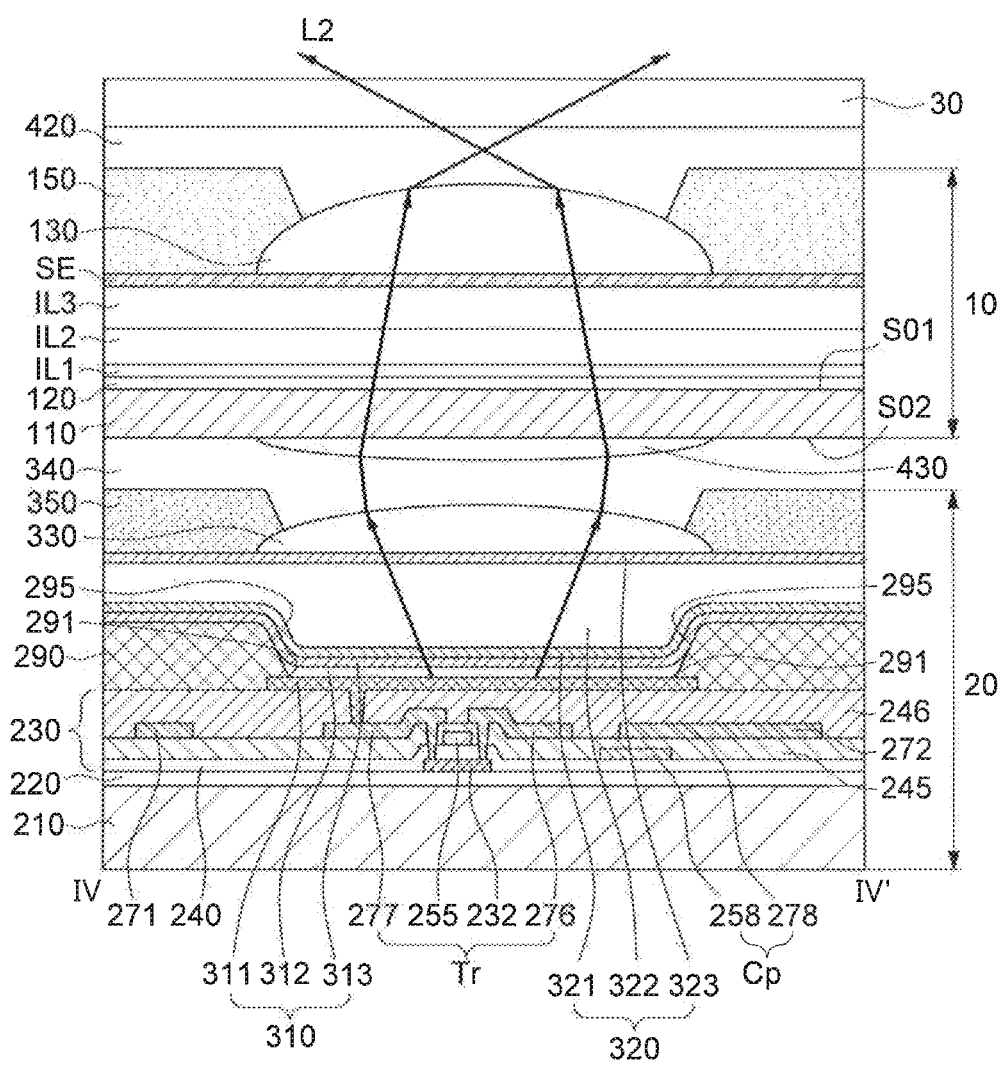
FIG. 13 is a cross-sectional view illustrating a display device according to an exemplary embodiment of the present invention.

FIG. 13 is a cross-sectional view illustrating a display device according to an exemplary embodiment of the present invention.

Referring to FIG. 13, the display device according to an exemplary embodiment of the present invention further includes a third lens 430 disposed on a lower surface of the substrate 110. In other words, the first lens 130 may be disposed on a first surface S01 of the substrate 110, and the third lens 430 may be disposed on a second surface S02 of the substrate 110 that is opposite to the first surface S01 of the substrate 110. The third lens 430 has a convex surface protruding in the direction away from the substrate 110 and toward the display unit 20. For example, the third lens 430 may protrude in a direction away from the second surface S02 of the substrate 110 and may face the second lens 330. The third lens 430 has a refractive index in a range from, for example, about 1.60 to about 1.80. For example, the third lens 430 may have a refractive index of about 1.65.

The third lens 430 may include, for example, a polymer organic material. The polymer organic material may include at least one of an acrylic resin, an epoxy resin, polyimide, and/or polyethylene. For example, the third lens 430 may be an acrylic lens including an acryl derivative, or a high refractive index lens including high refractive index nanoparticles. In addition, the third lens 430 may be a color filter. However, exemplary embodiments of the present invention are not limited thereto, and the third lens 430 may include various materials.

The third lens 430 overlaps the first electrode 311 of the OLED 310, and for example, the third lens 430 is located on the first electrode 311 and at the opening 295 of the pixel defining layer 290. In addition, the third lens 430 overlaps each of the first and second lenses 130 and 330. For example, the first lens 130, the second lens 330, the third lens 430, and the first electrode 311 overlap each other, and each are disposed in the light emission area of the OLED 310.

The third lens 430 may have a shape substantially the same as a shape of the first and second lenses 130 and 330 on a plane. For example, each of the first to third lenses 130, 330, and 430 may have a circular shape on a plane. However, exemplary embodiments of the present invention are not limited thereto, and for example, each of the first to third lenses 130, 330, and 430 may have an elliptical shape, a polygonal shape, and an irregular shape on a plane.

In addition, the first to third lenses 130, 330, and 430 have an area larger than that of the opening 295 on a plane. Accordingly, a light L2 emitted from the OLED 310 may be prevented from being absorbed through the first light blocking layer 150 of the fingerprint sensing unit 10, thereby minimizing the light loss. A diameter of the third lens 430 may be in a range from, for example, about 10 μm to about 100 μm, and a height of the third lens 430 may be in a range from, for example, about 0.5 μm to about 10 μm. However, exemplary embodiments of the present invention are not limited thereto, and the diameter and height of the third lens 430 may be variously designed in consideration of the size, resolution, or the like of the display device.

The filler 340 is disposed between the fingerprint sensing unit 10 and the display unit 20. For example, the filler 340 may be disposed directly contacting the second lens 330 and the second light blocking layer 350 of the display unit 20, and the substrate 110 and the third lens 430 of the fingerprint sensing unit 10. The filler 340 may include an organic material, for example, a polymer.

The filler 340 has a refractive index less than that of the third lens 430. The filler 340 may have a refractive index in a range from, for example, about 1.40 to about 1.60. For example, the third lens 430 may have a refractive index of about 1.65, and the filler 340 may have a refractive index of about 1.45. A light L2 emitted from the OLED 310 may be refracted at an interface between the filler 340 having a relatively low refractive index and the third lens 430 having a relatively high refractive index.

Accordingly, the linearity of the light L2 emitted from the OLED 310 may be increased. In addition, since the light L2 emitted from the OLED 310 may be prevented from being absorbed through the first light blocking layer 150 of the fingerprint sensing unit 10, the light loss may be minimized, and the light emission efficiency of the display device may be increased.

As set forth hereinabove, according to one or more exemplary embodiments of the present invention, the fingerprint sensing unit and the display device including the fingerprint sensing unit include a plurality of lenses disposed in a light emission area of the display device, and thus the display quality of the display device may be increased.

While the present invention has been shown and described with reference to the exemplary embodiments thereof, it will be apparent to those of ordinary skill in the art that various changes in form and detail may be formed thereto without departing from the spirit and scope of the present invention.

What is claimed is:

1. A fingerprint sensing unit comprising:
   a substrate;
   a scan line disposed on the substrate and extending along a first direction;
   a common power line disposed on the substrate and extending along a second direction crossing the first direction;
   a thin film transistor connected to the scan line and the common power line;
   a sensing electrode connected to the thin film transistor;
   a first lens disposed on the sensing electrode and protruding in a direction away from the sensing electrode, wherein the first lens directly contacts the sensing electrode; and
   a first light blocking layer disposed on the sensing electrode and surrounding the first lens, wherein the first light blocking layer directly contacts a portion of a convex surface, of the first lens, protruding in a direction away from the upper surface of the substrate.

2. The fingerprint sensing unit of claim 1, wherein the first lens has a refractive index in a range from about 1.60 to about 1.80.

3. The fingerprint sensing unit of claim 1, wherein the first lens comprises a plurality of lenses overlapping the sensing electrode.

4. The fingerprint sensing unit of claim 1, wherein the first light blocking layer overlaps at least part of the scan line, the common power line, the thin film transistor, and the sensing electrode.

5. The fingerprint sensing unit of claim 1, wherein the first lens is directly disposed on the sensing electrode.

6. A display device comprising:
   a display unit; and
   a fingerprint sensing unit disposed on the display unit, wherein the fingerprint sensing unit comprises:
      a substrate having a first surface and a second surface opposite the first surface;
      a scan line disposed on the first surface of the substrate, the scan line extending along a first direction;
      a common power line disposed on the first surface of the substrate, the common power line extending along a second direction crossing the first direction;
      a thin film transistor connected to the scan line and the common power line;
      a sensing electrode connected to the thin film transistor;
      a first lens disposed on the sensing electrode and protruding in a direction away from the sensing electrode, wherein the first lens directly contacts the sensing electrode; and a first light blocking layer disposed on the sensing electrode and surrounding the first lens, wherein the first light blocking layer directly contacts a portion of a convex surface, of the first lens, protruding in a direction away from the upper surface of the substrate, and the display unit comprises:
a base substrate;
an organic light emitting element disposed on the base substrate;
a thin film encapsulation layer disposed on the organic light emitting element;
a second lens disposed on the thin film encapsulation layer and protruding in a direction away from the thin film encapsulation layer; and
a second light blocking layer disposed on the thin film encapsulation layer and surrounding the second lens.

7. The display device of claim 6, wherein the first lens overlaps the second lens.

8. The display device of claim 6, wherein the first lens has a shape substantially the same as a shape of the second lens.

9. The display device of claim 6, wherein each of the first lens and the second lens has a refractive index in a range from about 1.60 to about 1.80.

10. The display device of claim 6, wherein the first lens and the second lens comprise a plurality of first lenses and a plurality of second lenses, respectively, wherein the plurality of first lenses and the plurality of second lenses overlap the sensing electrode.

11. The display device of claim 6, wherein each of the first light blocking layer and the second light blocking layer overlaps at least part of the scan line, the common power line, the thin film transistor, and the sensing electrode.

12. The display device of claim 6, wherein the organic light emitting element comprises:
a first electrode;
an organic light emitting layer disposed on the first electrode; and
a second electrode disposed on the organic light emitting layer.

13. The display device of claim 12, wherein each of the first lens and the second lens overlaps the first electrode.

14. The display device of claim 12, wherein the display unit further comprises a pixel defining layer disposed on the base substrate and including an opening that exposes at least a portion of the first electrode.

15. The display device of claim 14, wherein each of the first lens and the second lens has an area larger than an area of the opening of the pixel defining layer.

16. The display device of claim 6, further comprising a filler disposed between the display unit and the fingerprint sensing unit.

17. The display device of claim 16, wherein the filler has a refractive index in a range from about 1.40 to about 1.60.

18. The display device of claim 6, further comprising:
a window disposed on the fingerprint sensing unit; and
an adhesive layer disposed between the fingerprint sensing unit and the window.

19. The display device of claim 18, wherein the adhesive layer has a refractive index in a range from about 1.40 to about 1.60.

20. The fingerprint sensing unit of claim 6, wherein the first lens is directly disposed on the sensing electrode.

21. A display device comprising:
a display unit; and
a fingerprint sensing unit disposed on the display unit, wherein the fingerprint sensing unit comprises:
a substrate having a first surface and a second surface opposite the first surface;
a scan line disposed on the first surface of the substrate, the scan line extending along a first direction;
a common power line disposed on the first surface of the substrate, the common power line extending along a second direction crossing the first direction;
a thin film transistor connected to the scan line and the common power line;
a sensing electrode connected to the thin film transistor;
a first lens disposed on the sensing electrode and protruding in a direction away from the sensing electrode, wherein the first lens directly contacts the sensing electrode; and
a first light blocking layer disposed on the sensing electrode and surrounding the first lens, wherein the first light blocking layer directly contacts a portion of a convex surface, of the first lens, protruding in a direction away from the upper surface of the substrate; and
a third lens disposed on the second surface of the substrate and protruding in a direction away from the substrate, and
the display unit comprises:
a base substrate;
an organic light emitting element disposed on the base substrate;
a thin film encapsulation layer disposed on the organic light emitting element;
a second lens disposed on the thin film encapsulation layer and protruding in a direction away from the thin film encapsulation layer; and
a second light blocking layer disposed on the thin film encapsulation layer and surrounding the second lens.

22. The display device of claim 21, wherein the third lens overlaps the first lens and the second lens, and has a refractive index in a range from about 1.60 to about 1.80.

* * * * *